(12) United States Patent
Kuramoto et al.

(10) Patent No.: US 8,043,792 B2
(45) Date of Patent: Oct. 25, 2011

(54) COMPOSITION FOR FORMATION OF ANTIREFLECTION FILM AND PATTERN FORMATION METHOD USING THE SAME

(75) Inventors: Katsutoshi Kuramoto, Kawaguchi (JP); Masakazu Kobayashi, Kakegawa (JP); Yasushi Akiyama, Kakegawa (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 179 days.

(21) Appl. No.: 12/448,517

(22) PCT Filed: Dec. 21, 2007

(86) PCT No.: PCT/JP2007/074644
§ 371 (c)(1),
(2), (4) Date: Jun. 23, 2009

(87) PCT Pub. No.: WO2008/078677
PCT Pub. Date: Jul. 3, 2008

(65) Prior Publication Data
US 2010/0081087 A1 Apr. 1, 2010

(30) Foreign Application Priority Data
Dec. 27, 2006 (JP) ................................. 2006-352857

(51) Int. Cl.
*G03F 7/11* (2006.01)
*H01L 21/027* (2006.01)
(52) U.S. Cl. ....................... 430/273.1; 430/325; 430/326
(58) Field of Classification Search ........................ None
See application file for complete search history.

(56) References Cited

U.S. PATENT DOCUMENTS

| | | | |
|---|---|---|---|
| 3,808,004 A * | 4/1974 | Thomas et al. ............... | 430/156 |
| 5,310,604 A * | 5/1994 | Melancon et al. ............. | 428/447 |
| 5,985,519 A * | 11/1999 | Kakamu et al. ............... | 430/313 |
| 6,274,295 B1 | 8/2001 | Dammel et al. | |
| 2005/0239932 A1 | 10/2005 | Akiyama et al. | |
| 2007/0087125 A1 | 4/2007 | Maeda et al. | |
| 2008/0050433 A1 * | 2/2008 | Roreger et al. ............... | 424/484 |

FOREIGN PATENT DOCUMENTS

| | | | |
|---|---|---|---|
| EP | 0917002 A1 * | 5/1999 | |
| JP | 9-80755 A | 3/1997 | |
| JP | 2006-58404 A | 3/2006 | |
| JP | 2006-308814 A | 11/2006 | |
| WO | WO 98/54619 A1 | 12/1998 | |
| WO | WO-2005/107457 A1 * | 11/2005 | |

OTHER PUBLICATIONS

Allura Red AC—Wikipedia, the free encyclopedia, down loaded Feb. 18, 2011, three pages at http://en.wikipedia.org/wiki/Allura_Red_AC. The text was last modified on Feb. 7, 2011.*
English translation of JP, 2006-058404 a, A (2006) from machine translation from AIPN Japan Patent Office National Center for Industrial Property Information and Training, generated Feb. 18, 2011, 16 pages.*
AN 2006:1179686, CAPLUS from ACS no stn entered Nov. 10, 2006, Chemical ABstracts, English abstract of JP 2006308814 A pages 11 with registry numbers and compounds thereof also attached.*
English translation of JP, 2006-308814 a, A (2006) from machine translation from AIPN Japan Patent Office National Center for Industrial Property Information and Training, generated Feb. 18, 2011, 25 pages.*
Derwent-ACC-No. 2006-286789, Derwent-Week: 201051 Copyright 2011 Derwent Information Ltd , English abstract of JP 2006058404 A, three pages.*
English translation of JP 09-080755 A (1997) from machine translation from AIPN Japan Patent Office National Center for Industrial Property Information and Training, generated Feb. 20, 2011, 7 pages.*

* cited by examiner

*Primary Examiner* — Cynthia Hamilton
(74) *Attorney, Agent, or Firm* — Sangya Jain

(57) ABSTRACT

The present invention provides a composition for forming a top anti-reflection coating having such a low refractive index that it can be suitably used in pattern formation with an ArF excimer laser beam, and further the invention also provides a pattern formation method employing that composition. The top anti-reflection coating composition comprises a particular naphthalene compound, a polymer, and a solvent. The composition is used for forming a top anti-reflection coating provided on a photoresist layer. From the photoresist layer, a pattern can be formed by use of light in 160 to 260 nm.

7 Claims, No Drawings

COMPOSITION FOR FORMATION OF ANTIREFLECTION FILM AND PATTERN FORMATION METHOD USING THE SAME

This application is a United States National Stage Patent Application under 35 U.S.C. §371 of International Patent Application No. PCT/JP2007/074644, filed Dec. 21, 2007, which claims priority to Japanese Patent Application No. 2006-352857, filed Dec. 27, 2006, the contents of all documents being hereby incorporated herein by reference.

TECHNICAL FIELD

The present invention relates to a composition for forming a top anti-reflection coating. Specifically, this invention relates to a composition for forming an anti-reflection coating provided on the top surface of a resist layer when the resist layer is subjected to exposure in photolithographic processes for manufacture of flat panel displays (FPDs) such as liquid crystal displays, semiconductor devices, charge-coupled devices (CCDs), color filters and the like. The present invention also relates to a pattern formation method employing the top anti-reflection coating composition and to a top anti-reflection coating formed thereby.

BACKGROUND ART

Photolithographic processes have hitherto been used for manufacturing FPDs such as liquid crystal displays, semiconductor devices, CCDs, color filters and the like. For example, the photolithographic process for producing an integrated circuit device comprises: spreading a positive- or negative-working resist composition on a substrate; removing the solvent of the composition by baking; exposing the resist to radiation such as ultraviolet rays, far ultraviolet rays, electron beams or X-rays; and developing the exposed resist to form a resist pattern.

In many cases, the substrate used in the process has a high reflectance. Accordingly, in the exposure step, light having passed through the resist layer is often reflected by the substrate and then reenters the resist layer again, so that the light is applied to the resist layer even in areas not expected to be exposed. As a result, there is a problem that the aimed pattern cannot be obtained or that the obtained pattern may have defects. Further, reflection of the light at the interface between the substrate and the resist layer often causes a standing-wave effect to corrugate the resist layer, and consequently serious troubles may occur in controlling the line width of the resist pattern. These phenomena are remarkable particularly when light of a shorter wavelength is used in the exposure step to form a finer pattern.

For the purpose of coping with those problems, various methods have been studied and developed. For example, there have been proposed a method in which a dye having absorption in the wavelength range of light for exposure is dispersed in the resist, a method in which a bottom anti-reflection coating (BARC) or a top anti-reflection coating (TARC) is provided, a top surface imaging (TSI) method, and a multilayer resist (MLR) method. Among them, the method employing a bottom anti-reflection coating is most popularly adopted at present. As the bottom anti-reflection coating, there are known inorganic anti-reflection coatings and organic ones. The inorganic coatings can be formed by known methods in which inorganic or metal material is deposited according to, for example, CVD (chemical vapor deposition) process, normal vapor deposition process or sputtering process. The organic coatings can be also formed by known methods in which the substrate is coated, for example, with an organic polymer solution dissolving or dispersing a dye or with a solution or dispersion of a polymer dye containing chromophores chemically combined with a polymer skeleton.

Meanwhile, it is known that a top anti-reflection coating can be formed by applying a composition containing a fluorine compound, such as perfluorooctanic acid or perfluorooctanesulfonic acid, onto the top surface of the resist layer. The top anti-reflection coating reduces interference of light caused by thickness variation of the resist layer, so as to form a pattern in the aimed shape. It is, therefore, required for the top anti-reflection coating to have both a low refractive index and a high transmittance.

It is known that multiple interference changes the pattern dimension to the smallest degree when the refractive index of the top anti-reflection coating ($n_t$) and that of the resist layer ($n_r$) satisfy the condition of: $n_t=\sqrt{n_r}$. On the other hand, when the resist layer is treated with an ArF excimer laser, the refractive index of the resist layer is normally approx. 1.70 at 193 nm, which is the wavelength of ArF excimer laser beams. Accordingly, in that case, the optimal refractive index of the top anti-reflection coating is approx. 1.30.

In spite of that, it is difficult to form a top anti-reflection coating having such a low refractive index. In many practical cases, a top anti-reflection coating having a relatively low refractive index is formed from highly fluorinated polymer materials. However, even though the top anti-reflection coating is formed from those materials, its refractive index is nevertheless not less than approx. 1.4. Further, the highly fluorinated polymer materials are generally expensive, and hence it has been desired to replace them with a new composition for forming a top anti-reflection coating.

In the meantime, it is studied to make the anti-reflection coating have absorption at a particular wavelength so as to obtain preferred effects by use of anomalous dispersion (see, Patent document 1). The term "anomalous dispersion" means a phenomenon in which the refractive index changes drastically at the wavelength where the coating absorbs light. However, Patent document 1 is silent about what compound should be used for the coating exposed to light of a short wavelength such as an ArF excimer laser beam. Further, the present inventors' study has revealed that, in order to obtain the preferred refractive index, it is not enough if the absorption wavelength merely corresponds to the exposure wavelength.

[Patent document 1] U.S. Pat. No. 6,274,295

DISCLOSURE OF INVENTION

Problem to be Solved by the Invention

It is an object of the present invention to solve the above problems and to provide a composition capable of forming a top anti-reflection coating having a low refractive index.

Means for Solving Problem

The present invention resides in a top anti-reflection coating composition for forming a top anti-reflection coating provided on a photoresist layer from which a pattern is formed by use of light in the wavelength range of 160 to 260 nm, comprising a naphthalene compound, a polymer, and a solvent.

The present invention also resides in a pattern formation method comprising:

applying a resist composition onto a substrate to form a resist layer, coating the resist layer with an anti-reflection coating composition comprising a naphthalene compound, a polymer, and a solvent; and then drying the composition, imagewise exposing the resist layer to light of 160 to 260 nm, and developing the exposed resist layer.

The present invention further resides in a top anti-reflection coating provided on a photoresist layer from which a pattern is formed by use of light in the wavelength range of 160 to 260 nm, comprising a naphthalene compound and a polymer.

Effect of the Invention

In the exposure step of lithographic process particularly for forming a fine pattern, the present invention can effectively reduce the standing-wave effect caused by reflection of light at the interface between the substrate and the resist layer. Accordingly, the present invention prevents the resist pattern from size variation, and thereby gives the desired pattern. Further, from the composition according to the present invention, a top anti-reflection coating can be formed at low cost.

BEST MODE FOR CARRYING OUT THE INVENTION

The top anti-reflection coating composition according to the present invention comprises a naphthalene compound, a polymer, and a solvent.

The naphthalene compound absorbs light of 160 to 260 nm. Generally, if a thin film has absorption at a particular wavelength, its refractive index varies steeply around the absorption wavelength. This phenomenon is referred to as "anomalous dispersion". In the present invention, the top anti-reflection coating has absorption in the wavelength range of 160 to 260 nm since the composition contains the naphthalene compound, and accordingly it exhibits the anomalous dispersion and hence has a low refractive index in that wavelength range. This is not simply attributed to the absorption in 160 to 260 nm, but is given by specific characteristics of the naphthalene compound.

Accordingly, any naphthalene compound can be used to obtain the effect of the present invention as long as it has a naphthalene skeleton. However, the effect of the present invention is remarkable if the naphthalene compound is represented by the following formula (I):

[Chemical formula 1]

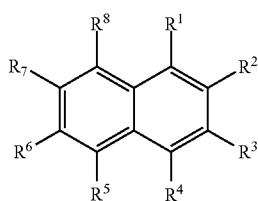
(I)

wherein each of $R^1$ to $R^8$ is independently one selected from the group consisting of:
—H,
—$(CH_2)_{n1}OH$,
—$(CH_2)_{n2}COOH$,
—$(CH_2)_{n2}NH_2$,
—$(CH_2)_{n2}COONH_2$,
—$(CH_2)_{n2}SO_3H$, and
—$(CH_2)_{n2}SO_2NH_2$ (in which n1 is an integer of 1 to 4, and n2 is an integer of 0 to 4).

If n1 and n2 are too large, the compound is liable to have such poor solubility that the compound in the form of insoluble crystallites may remain in the solvent to cause reflection of light. Therefore, each of n1 and n2 must be 4 or less.

Further, six or more of $R^1$ to $R^8$ are preferably hydrogen atoms (—H).

The content of the naphthalene compound depends on the aimed refractive index, the solubility in the solvent, the coatability of the composition, and the thickness of the coating. It is preferably 0.05 to 1.5 wt. %, more preferably 0.2 to 0.5 wt. % based on the total weight of the top anti-reflection coating composition.

In the present invention, the polymer serves as a binder in the top anti-reflection coating. The polymer can be freely selected according to the purpose. Particularly preferred polymers are (a) fluorinated polymers, (b) acidic polymers, (c) neutral polymers, and (d) alkaline polymers.

(a) The fluorinated polymer preferably contains a carboxyl group in any of the repeating units constituting the polymer structure thereof. Examples of that preferred fluorinated polymer, which is soluble in an aqueous solution, include: a fluorinated polymer comprising a repeating unit represented by the following formula (II):

—[$CF_2CF(OR_fCOOH)$]—  (II)

(in which $R_f$ is a straight-chain or branched-chain perfluoroalkyl group which may contain an ether oxygen atom), and a fluorinated polymer comprising the repeating unit of the formula (II) and another repeating unit represented by the following formula (III):

—[$CF_2CFX$]—  (III)

(in which X is a fluorine atom or a chlorine atom). The fluorinated polymer preferably has a weight average molecular weight of 1,000 to 100,000 in terms of polystyrene equivalent.

(b) The acidic polymers include, for example, polyacrylic acid, poly(α-trifluoromethylacrylic acid), N-methylpyrrolidone-acrylic acid copolymer, N-methylpyrrolidone-methacrylic acid copolymer, N-methylpyrrolidone-maleic acid copolymer, N-methylpyrrolidone-itaconic acid copolymer, and N-methylpyrrolidone-methyl itaconate copolymer.

(c) The neutral polymers include, for example, polyvinyl alcohol, polyvinyl pyrrolidone, ethylene glycol-propylene glycol copolymer, vinyl methyl ether-maleic anhydride copolymer, N-methylpyrrolidone-vinyl acetate copolymer, N-methylpyrrolidone-vinyl alcohol copolymer, N-methylpyrrolidone-methyl acrylate copolymer, N-methyl pyrrolidone-methyl methacrylate copolymer, N-methyl pyrrolidone-dimethyl maleate copolymer, and N-methyl pyrrolidone-itaconic anhydride copolymer.

(d) The alkaline polymers include, for example, polyallylamine and the like.

Among the above polymers, the fluorinated polymers are preferred because they often give lower refractive indexes.

The polymer preferably has a weight average molecular weight of 1,000 to 100,000 in terms of polystyrene equivalent. The content of the polymer depends on the solubility in the solvent, the coatability of the composition, and the thickness of the coating. It is preferably 0.4 to 5 wt. %, more preferably 1 to 4 wt. % based on the total weight of the top anti-reflection coating composition.

The top anti-reflection coating composition of the present invention further contains a solvent. The solvent can be freely selected as long as it can dissolve the naphthalene compound, the polymer, and various other optional additives described later. The solvent is preferably water or an organic solvent. If water is used as the solvent, it is preferred to remove organic impurities, metal ions and the like from the water by distillation, by ion-exchange treatment, by filtration treatment or by various adsorption treatments.

Examples of the organic solvent include: (a) hydrocarbons, such as n-hexane, n-octane and cyclohexane; (b) alcohols, such as methyl alcohol, ethyl alcohol and isopropyl alcohol; (c) ketones, such as acetone and methyl ethyl ketone; (d) esters, such as methyl acetate, ethyl acetate and ethyl lactate; and (e) other polar solvents, such as dimethylformamide, dimethyl sulfoxide, methyl cellosolve, cellosolve, butyl cellosolve, cellosolve acetate, alkylcellosolve acetate, butylcarbitol and carbitol acetate. The solvent can be freely selected from those according to the aimed properties. It is also possible to use mixtures of those solvents or of water and the solvents. For example, the mixture comprises not less than 60 wt. % but less than 99.9 wt. % of a hydrocarbon having 5 to 20 carbon atoms and not less than 0.1 wt. % but less than 40 wt. % of an alcohol having 1 to 20 carbon atoms. This mixed solvent is particularly preferred because it hardly dissolves the resist layer.

The top anti-reflection coating composition of the present invention may furthermore contain optional additives. The additives are incorporated so as to improve coatability of the composition onto the resist layer and/or to improve the properties of the resultant anti-reflection coating. Examples of the optional additives include surfactants. The surfactants include, for example, (a) anionic surfactants, such as alkyldiphenyletherdisulfonic acid, alkyldiphenylethersulfonic acid, alkylbenzenesulfonic acid, polyoxyethylenealkylethersulfate, alkylsulfate, and ammonium salts or organic amine salts thereof; (b) cationic surfactants, such as hexadecyltrimethylammonium hydroxide; (c) nonionic surfactants, such as polyoxyethylenealkylether (e.g., polyoxyethylenelaurylether, polyoxyethyleneoleylether, polyoxyethylenecetylether), polyoxyethylene-fatty acid diester, polyoxyethylene-fatty acid monoester, polyoxy-ethylene-polyoxypropylene block polymer, and acetylene glycol derivatives; and (d) amphoteric surfactants, such as 2-alkyl-N-carboxymethyl-N-hydroxyethyl-imidazoliniumbetaine, and amidopropylhydroxysulfonebetaine laurylate. Those examples, however, by no means restrict the usable surfactants. Besides the above, thickening agents, colorants such as dyes, acids and bases are also usable as the additives. The contents of these additives are determined in consideration of effects thereof, but are generally 0.01 to 1 wt. %, preferably 0.1 to 0.5 wt. % based on the total weight of the composition.

The top anti-reflection coating composition according to the present invention can be used in the same manner as a conventional one. In other words, it is unnecessary to change the pattern formation process considerably when the composition of the present invention is practically used. The pattern formation method employing the top anti-reflection coating composition of the present invention is concretely explained below.

First, a resist composition is spread by a known coating method such as spin-coating on a substrate such as a silicon or glass substrate, which may be pre-treated, if necessary. Before the resist composition is applied, a bottom anti-reflection coating may be previously provided under the resist by coating. The bottom anti-reflection coating can improve the section shape and the exposure margin in cooperation with the top anti-reflection coating formed from the composition of the present invention.

Any known resin composition can be used in the pattern formation method of the present invention. Representative examples of the resist compositions usable in the present invention include: positive-working compositions, such as a composition comprising a quinonediazide type photosensitive substance and an alkali-soluble resin, and a chemically amplified resist composition; and negative-working compositions, such as a composition comprising a photosensitive functional group-containing polymer such as polyvinyl cinnamate, a composition comprising an azide compound such as an aromatic azide compound or a bisazide compound with a cyclized rubber, a composition comprising a diazo resin, a photo-polymerizable composition comprising an addition-polymerizable unsaturated compound, and a chemically amplified negative-working resist composition.

Examples of the quinonediazide type photo-sensitive substance used in the positive-working composition comprising a quinonediazide type photosensitive substance and an alkali-soluble resin include: 1,2-benzoquinonediazide-4-sulfonic acid, 1,2-naphtho-quinonediazide-4-sulfonic acid, 1,2-naphthoquinone-diazide-5-sulfonic acid, and sulfonic esters or amides thereof. Examples of the alkali-soluble resin include: novolak resin, polyvinyl phenol, polyvinyl alcohol, and copolymers of acrylic acid or methacrylic acid. The novolak resin is preferably prepared from one or more phenols such as phenol, o-cresol, m-cresol, p-cresol and xylenol in combination with one or more aldehydes such as formaldehyde and paraformaldehyde.

Either positive- or negative-working chemically amplified resist composition can be used in the pattern formation method of the present invention. The chemically amplified resist generates an acid when exposed to radiation, and the acid serves as a catalyst to promote chemical reaction by which solubility to a developer is changed within the areas irradiated with the radiation to form a pattern. For example, the chemically amplified resist composition comprises an acid-generating compound, which generates an acid when exposed to radiation, and an acid-sensitive functional group-containing resin, which decomposes in the presence of acid to form an alkali-soluble group such as phenolic hydroxyl or carboxyl group. The composition may comprise an alkali-soluble resin, a crosslinking agent and an acid-generating compound.

The resist composition layer formed on the substrate is prebaked, for example, on a hot plate to remove solvent contained in the composition, to form a photoresist layer. The prebaking temperature depends on the solvent and the resist composition, but is normally 20 to 200° C., preferably 50 to 150° C.

On the formed resist layer, the top anti-reflection coating composition of the present invention is applied by spin-coating and the like and then the solvent is evaporated to form a top anti-reflection coating. The top anti-reflection coating thus obtained has a thickness of generally 10 to 80 nm, preferably 20 to 65 nm.

In the above procedure, before the resist composition layer formed on the substrate is completely dried, the top anti-reflection coating composition may be applied thereon. Even so, the solvent of the anti-reflection coating composition can be removed by the prebaking described above.

The top anti-reflection coating thus formed can realize a refractive index of generally 1.40 to 1.50. In particular, the top anti-reflection coating according to the present invention can have such a low refractive index even at a short wavelength of 160 to 260 nm. The top anti-reflection coating of the present invention preferably exhibits an extinction coefficient curve having a maximum value of 0.01 to 1.00 in the wavelength range of 160 to 260 nm. The maximum value is particularly preferably not less than 0.05 since the effect of anomalous dispersion appears strongly. Further, the extinction coefficient at 193 nm is preferably more than 0 but not more than 0.5. If having that extinction coefficient, the top anti-reflection coating shows a low refractive index and excellent characteristics.

The resist layer is then exposed through a mask, if necessary, to light in the wavelength range of 160 to 260 nm, preferably, to ArF excimer laser beams.

After the exposure, baking treatment may be carried out, if necessary, and then development such as paddle development is carried out to form a resist pattern. The resist layer is normally developed with an alkali developer. Examples of the alkali developer include an aqueous solution of sodium hydroxide or tetramethylammonium hydroxide (TMAH). After the development, the resist pattern is rinsed (washed) with a rinse solution, preferably, pure water. The resist pattern thus-formed is employed as a resist for etching, plating, ion diffusion or dyeing, and then, if necessary, peeled away.

The thickness of the resist pattern is properly determined according to the aimed use, but is in the range of generally 0.1 to 2.5 μm, preferably 0.2 to 1.5 μm.

The resist pattern obtained by the pattern formation method of the present invention is then further fabricated or processed according to the aimed use. The pattern formation method of the present invention by no means restricts the subsequent procedures, and hence the resist pattern can be fabricated or processed in known manners.

The pattern formed by the method of the present invention can be employed for manufacture of flat panel displays (FPDs) such as liquid crystal displays, semiconductor devices, charge-coupled devices (CCDs), color filters and the like, in the same manner as the pattern formed by the conventional method is employed for.

Examples 1 to 5 and Comparative Examples 1 to 8

An anti-reflection coating composition was prepared by dissolving in 2-butanol a fluorinated polymer (weight average molecular weight: 5,000) represented by the formula (II) in which $R_f$ was a fluorinated alkyl group of three carbon atoms in the amount of 3 wt. % based on the total weight of the composition, together with each compound shown in Table 1 in each amount also shown in Table 1. The obtained composition was then applied on a substrate by means of a spin-coater (Mark 8 [trademark], manufactured by Tokyo Electron Ltd.), and baked on a hot-plate at 90° C. for 60 seconds to form a coating. The refractive index and extinction coefficient of the obtained coating were measured at 193 nm and at 248 nm by means of an ellipsometer (VUV-302 [trademark], manufactured by J.A. Woollam (Japan) Co., Inc.). The results were as set forth in Table 2.

TABLE 1

| | Compound | Amount |
|---|---|---|
| Ref. | — | — |
| Ex. 1 | 2-(1-naphthyl)ethanol | 0.43% |
| Ex. 2 | 1-naphtylmethanol | 0.39% |
| Ex. 3 | 1-naphthylacetic amide | 0.46% |
| Ex. 4 | 1-naphthylacetic acid | 0.46% |
| Ex. 5 | 5-naphthylsulfonic acid | 0.30% |
| Com. 1 | aniline | 0.23% |
| Com. 2 | triethylene glycol | 0.30% |
| Com. 3 | p-aminophenol | 0.27% |
| Com. 4 | EG-PG polymer *[1] | 0.10% |
| Com. 5 | N-methylpyrrolidone | 0.27% |
| Com. 6 | anthracene-containing polymer *[2] | 0.10% |
| Com. 7 | anthranilic acid | 0.34% |
| Com. 8 | ascorbic acid | 0.44% |

(Remarks) The amounts are based on the total weight of the composition.
[Chemical formula 2]
*[1] EG-PG copolymer (Molecular Weight approx. 3,000)
—(CH$_2$CH$_2$O)$_m$—(CH$_2$CH$_2$CH$_2$O)$_n$—

*[2] Anthracene-containing polymer (Molecular weight approx. 15,000)

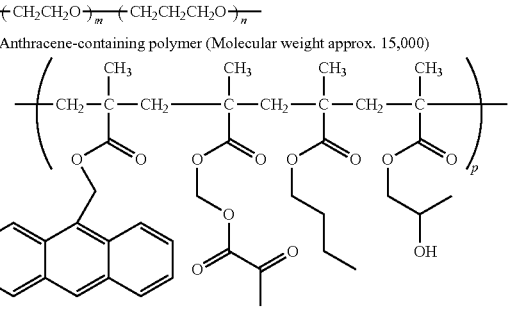

TABLE 2

| | 193 nm | | | 248 nm | | | Ex. coef. curve | |
|---|---|---|---|---|---|---|---|---|
| | $n_t$ | Change of $n_t$ | Ex. coef. | $n_t$ | Change of $n_t$ | Ex. coef. | $\lambda_{max}$ (nm) | Max. value |
| Ref. | 1.458 | — | 0.001 | 1.410 | — | 0.000 | — | — |
| Ex. 1 | 1.421 | −0.037 | 0.036 | 1.440 | 0.030 | 0.011 | 220 | 0.216 |
| Ex. 2 | 1.456 | −0.002 | 0.147 | 1.435 | 0.025 | 0.042 | 220 | 0.187 |
| Ex. 3 | 1.431 | −0.027 | 0.062 | 1.524 | 0.114 | 0.014 | 216 | 0.250 |
| Ex. 4 | 1.411 | −0.047 | 0.033 | 1.468 | 0.058 | 0.015 | 220 | 0.177 |
| Ex. 5 | 1.409 | −0.049 | 0.039 | 1.543 | 0.133 | 0.052 | 226 | 0.246 |
| Com. 1 | 1.615 | 0.157 | 0.064 | 1.470 | 0.060 | 0.005 | — | — |
| Com. 2 | 1.487 | 0.029 | 0.029 | 1.432 | 0.022 | 0.000 | — | — |
| Com. 3 | 1.691 | 0.233 | 0.321 | 1.533 | 0.123 | 0.000 | — | — |
| Com. 4 | 1.510 | 0.052 | 0.000 | 1.416 | 0.006 | 0.014 | — | — |
| Com. 5 | 1.500 | 0.042 | 0.054 | 1.443 | 0.033 | 0.000 | — | — |
| Com. 6 | 1.480 | 0.022 | 0.015 | 1.432 | 0.022 | 0.013 | — | — |
| Com. 7 | 1.492 | 0.034 | 0.179 | 1.507 | 0.097 | 0.016 | — | — |
| Com. 8 | 1.493 | 0.035 | 0.014 | 1.452 | 0.042 | 0.038 | — | — |

(Remarks)
$n_t$: refractive index,
Change of $n_t$: how much the refractive index is changed from the reference,
Ex. coef. curve: extinction coefficient curve ranging from 160 nm to 260 nm, and
$\lambda_{max}$: wavelength giving the maximum value Example 6

An anti-reflection coating composition was prepared by dissolving in 2-butanol a fluorinated polymer (weight average molecular weight: 5,000) represented by the formula (II) in which $R_f$ was a fluorinated alkyl group of three carbon atoms in the amount of 3 wt. % based on the total weight of the composition, together with 2-(1-naphthyl)ethanol as the naphthalene compound in the amount of 0.43 wt. % based on the total weight of the composition. The obtained composition was then applied on a silicon wafer and evaluated in the same manner as in Example 1. As a result, it was found that the representative peak of extinction coefficient was positioned at 220 nm and that the refractive index and extinction coefficient were 1.423 and 0.037, respectively, at 193 nm.

Example 7

The procedure of Example 6 was repeated except that the polymer and the solvent were replaced with polyallylamine (molecular weight: approx. 8,000) and ethanol, respectively. As a result, it was found that the representative peak of extinction coefficient was positioned at 228 nm and that the refractive index and extinction coefficient were 1.856 and 0.127, respectively, at 193 nm and were 1.77 and 0.293, respectively, at 248 nm.

From the comparison between the results of Examples 6 and 7, it was concluded that the absorption of the naphthalene compound gave the same effect of anomalous dispersion even if the polymer was changed.

Comparative Example 9

The procedure of Example 6 was repeated except that the naphthalene compound was not used. As a result, it was found that the refractive index and extinction coefficient were 1.458 and 0.001, respectively, at 193 nm. These results indicated that the naphthalene compound worked on lowering the refractive index of the top anti-reflection coating of Example 6.

Comparative Example 10

The procedure of Example 7 was repeated except that the naphthalene compound was not used. As a result, it was found that the refractive index and extinction coefficient were 1.865 and 0.144, respectively, at 193 nm and were 1.921 and 0.000, respectively, at 248 nm. These results indicated that the naphthalene compound worked on lowering the refractive index of the top anti-reflection coating of Example 7.

Examples 8 to 11

An ArF photoresist composition (AX1120P [trademark], manufactured by AZ Electronic Materials (Japan) K.K.) was spin-coated on substrates, to form 2000 Å-thick resist layers. On the obtained resist layers, the top anti-reflection coating compositions of Examples 1 to 4 were individually applied to form 320 Å-thick top anti-reflection coatings. Thereafter, each resist layer was imagewise exposed to ArF excimer beams, and then developed to form a pattern. All the resist layers were formed without troubles, and the obtained patterns were highly precise and excellent in shapes.

The invention claimed is:

1. A top anti-reflection coating composition for forming a top anti-reflection coating provided on a photoresist layer from which a pattern is formed by use of light, comprising a naphthalene compound, an aqueous soluble fluorinated polymer, and a solvent, further where the naphthalene compound is represented by the following formula (I):

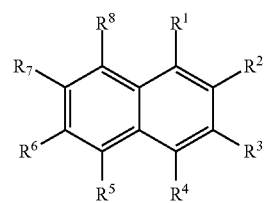

wherein each of $R^1$ to $R^8$ is independently one selected from the group consisting of:
—H
—$(CH_2)_{n1}OH$,
—$(CH_2)_{n2}COOH$,
—$(CH_2)_{n2}NH_2$,
—$(CH_2)_{n2}COONH_2$,
—$(CH_2)_{n2}SO_3H$, and
—$(CH_2)_{n2}SO_2NH_2$,
where n1 is an integer of 1 to 4, and n2 is an integer of 0 to 4, and further where the wavelength of light is 193 nm.

2. The top anti-reflection coating composition according to claim 1, wherein said solvent is water or an organic solvent.

3. The top anti-reflection coating composition according to claim 2, wherein said solvent is a mixed solvent comprising not less than 60 wt. % but less than 99.9 wt. % of a hydrocarbon containing 5 to 20 carbon atoms and not less than 0.1 wt. % but less than 40 wt % of an alcohol containing 1 to 20 carbon atoms.

4. A pattern formation method comprising:
applying a resist composition onto a substrate to form a resist layer,
coating the resist layer with an anti-reflection coating composition of claim 1; and then drying the composition,
imagewise exposing the resist layer to light of 193 nm, and developing the exposed resist layer.

5. An article comprising a top anti-reflection coating of claim 1 provided on a photoresist layer.

6. The top anti-reflection coating according to claim 5, wherein the extinction coefficient at 193 nm is more than 0 but not more than 0.5.

7. The top anti-reflection coating composition according to claim 1, wherein said naphthalene compound is selected from a group consisting of 5-naphthylsulfonic acid, 1-naphthylacetic acid, 1-naphthylacetic amide, 1-naphthylmethanol and 2-(1-naphthyl)ethanol.

* * * * *